Figure 1:
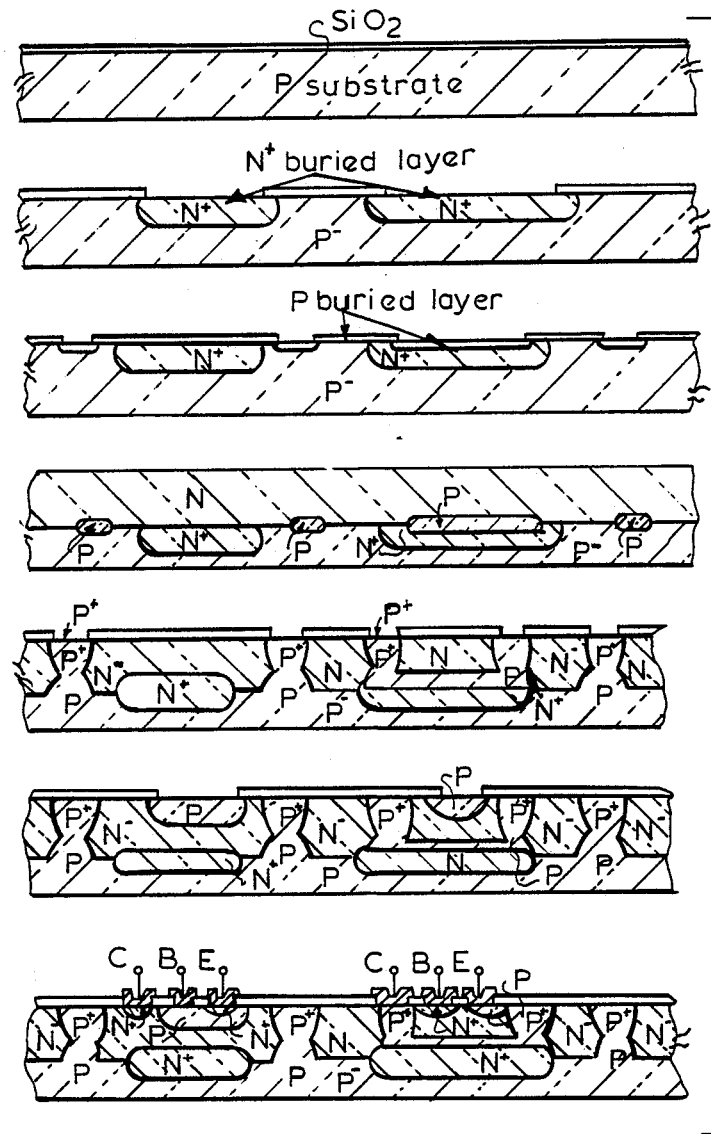

United States Patent [19]

Zambrano et al.

[11] Patent Number: 4,898,836

[45] Date of Patent: Feb. 6, 1990

[54] PROCESS FOR FORMING AN INTEGRATED CIRCUIT ON AN N TYPE SUBSTRATE COMPRISING PNP AND NPN TRANSISTORS PLACED VERTICALLY AND INSULATED ONE FROM ANOTHER

[75] Inventors: Raffaele Zambrano, Mercato San Severino; Salvatore Musumeci, Riposto, both of Italy

[73] Assignee: SGS-Thomson Microelectronics S.R.L., Agrate Brianza, Italy

[21] Appl. No.: 341,540

[22] Filed: Apr. 21, 1989

[30] Foreign Application Priority Data

Apr. 28, 1988 [IT] Italy ............................... 20357 A/88

[51] Int. Cl.⁴ ............................................. H01L 27/02
[52] U.S. Cl. ........................................ 437/31; 357/44; 357/48; 357/47
[58] Field of Search ...................... 437/31; 357/48, 44, 357/47

[56] References Cited

U.S. PATENT DOCUMENTS

| | | | |
|---|---|---|---|
| 3,079,287 | 2/1963 | Anderson | 437/31 |
| 3,702,428 | 11/1972 | Schmitz | 148/175 |
| 3,793,088 | 2/1974 | Eckton | 437/31 |
| 3,930,909 | 1/1976 | Schmitz | 148/175 |
| 3,956,035 | 5/1976 | Hermann | 148/175 |
| 3,971,059 | 7/1976 | Dunkley | 437/31 |
| 4,038,680 | 7/1977 | Yagi | 357/44 |
| 4,054,899 | 10/1977 | Stehlin | 357/44 |
| 4,260,999 | 4/1981 | Yoshioka | 357/45 |

FOREIGN PATENT DOCUMENTS

| | | |
|---|---|---|
| 0093304 | 4/1983 | European Pat. Off. . |
| 194465 | 11/1984 | Japan . |
| 1193692 | 6/1970 | United Kingdom . |

OTHER PUBLICATIONS

"Designing A Micro Electronic Diferential Amplifier", Electron Products, pp. 34–37, Jul. 1962.

Primary Examiner—Brian E. Hearn
Assistant Examiner—Anthony Gutiervez
Attorney, Agent, or Firm—Herbert Dubno

[57] ABSTRACT

In this process P+ type regions are diffused on a substrate of N type semiconductor meterial, said regions forming the horizontal isolation region of the NPN transistors and the low-resistivity collector region of the PNP transistors. Within each isolation region a high-concentration N+ type zone is created that acts as a low-resistivity collector region for the NPN transistors. An N type epitaxial layer is then grown over the whole surface of the device. The completion of the device is carried out in such a way to ensure that the low-concentration collector thickness of transistors NPN be practically equal to the low-concentration collector thickness of transistors PNP.

2 Claims, 4 Drawing Sheets

PROCESS FOR FORMING AN INTEGRATED CIRCUIT ON AN N TYPE SUBSTRATE COMPRISING PNP AND NPN TRANSISTORS PLACED VERTICALLY AND INSULATED ONE FROM ANOTHER

The present invention concerns a process for forming an integrated circuit on an N type substrate, comprising PNP and NPN transistors with vertical current flow, insulated one from another.

In a well-known process for making integrated circuits of the above kind, N+ type regions are diffused on a P type substrate, some of said regions being used as buried collector regions of the NPN transistors, others as buried isolation regions for the PNP transistors. Than P type regions are created by diffusion, some overlying the above-mentioned buried regions isolating the PNP transistors and destined to form the buried collector regions of said transistors, others being made directly onto the substrate and used to make isolating regions.

A N type epitaxial layer is then grown, isolation regions are defined, base and emitter regions are made by diffusion, contacts are opened and the related zones metallized, all in accordance with the stages illustrated in FIG. 1.

Figure 2:
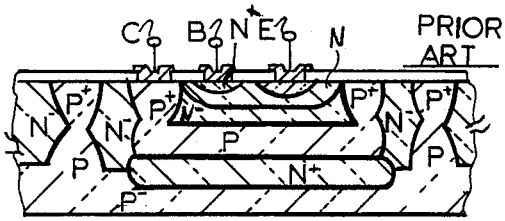

To overcome the punch-through problem for the PNP transistors, caused by larger concentration of impurities in the collector compared with the concentration in the base, it is advisable to increase the doping concentration of the base; for this purpose diffusion of the emitter regions of the PNP transistors is preceded by implantation of a N+ type region creating a structure like that illustrated in FIG. 2.

PNP transistors so obtained, however, have a low level of efficiency as regards current handling (due to high base resistivity), frequency response (base being too thick) and saturation voltages (due to high collector series resistance).

Other processes, examples of which appear in European patent application EP 0093304 and in Tech. Dig. 1980 IEEE p. 65 (see stages illustrated in FIG. 3), tend to improve the process by means of triple diffused structures. Nevertheless some drawbacks are still present in these structures, such as:
- high collector series resistance for the PNP transistors;
- thickness of the collector region with low doping concentration is found to be larger in NPN transistors than in PNP transistors,
- the process is appreciably longer and more expensive.

Even other processes, examples of which appear in the GB Patent N. 1,193,692 and in JP Patent N. 59-194465, tend to improve the process, but maintain some drawbacks due to the great difference of the low-concentration collector thicknesses of transistors PNP and NPN.

The present invention enables to overcome these drawbacks since PNP and NPN transistors are thereby realized with reduced collector series resistances and practically equal low-concentration collector thicknesses, ensuring this way an excellent dynamic performance without foregoing maximum operational voltage.

This scope is achieved through the process described by following claim 1.

Figure 3:
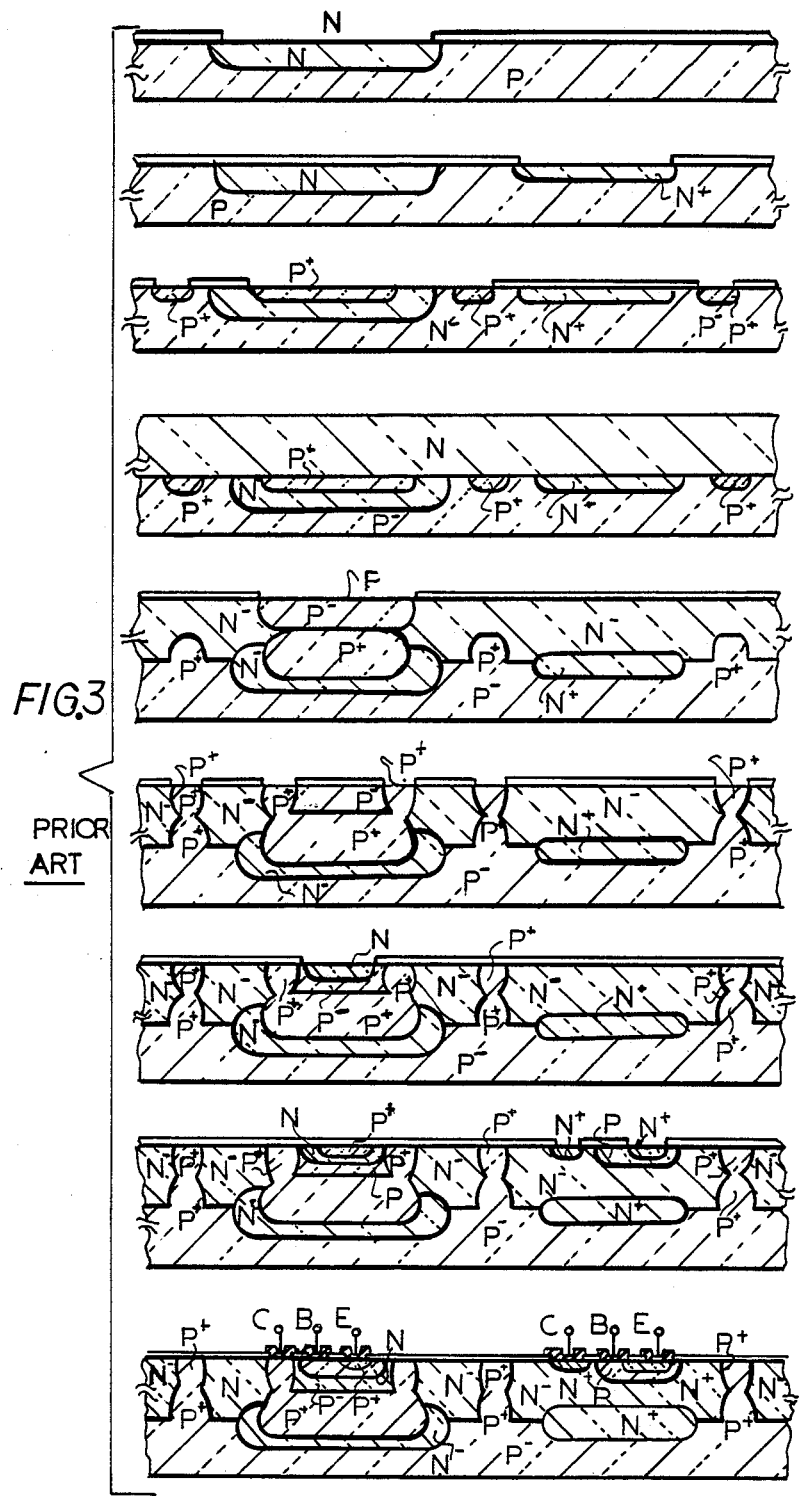
Figure 8:
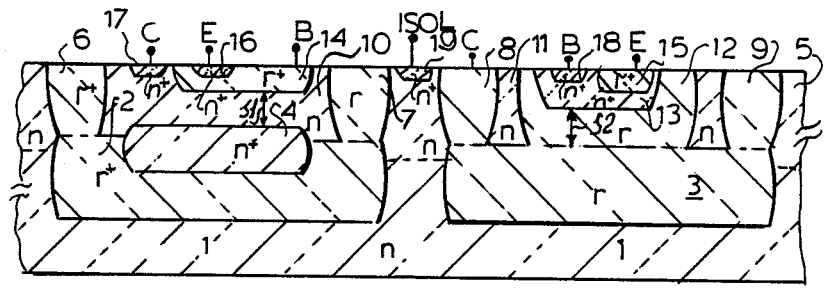
Figure 9:
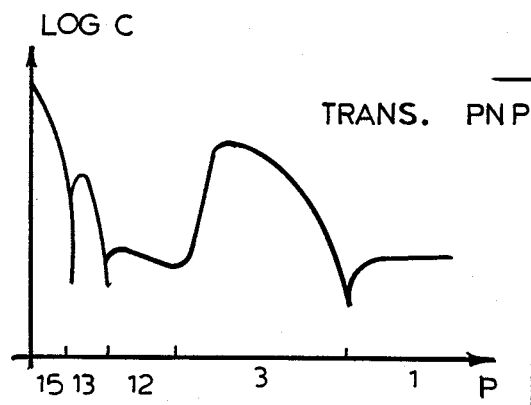
Figure 9:
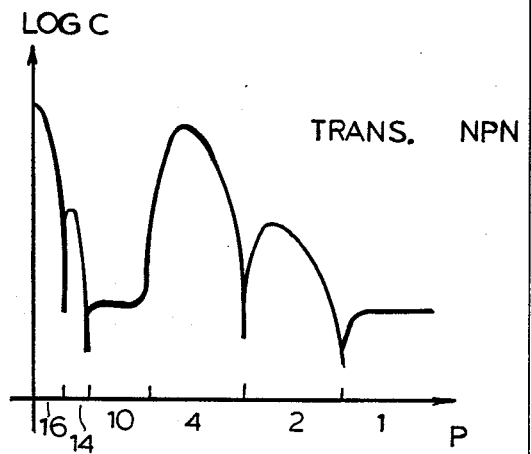

The characteristics of the process according to the invention will be made clearer by the following description and the attached drawings illustrating one non-limitative example of the same, wherein the various figures diagrammatically represent:

FIGS. 1, 2, 3. Illustrate the aforementioned prior art processes;

FIGS. 4, 5, 6, 7, 8: the structure as it appears during the different stages of the process;

FIG. 9: doping concentration profiles along a section of the NPN and PNP transistors respectively, obtained by the process as illustrated in FIGS. 5 to 8.

Figure 4:
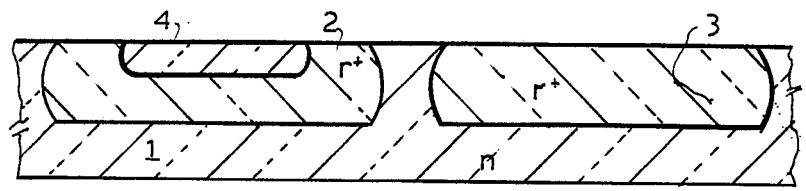

Referring to FIG. 4, on an N type single-crystal silicon substrate 1, two P+ type regions 2 and 3 are made in the normal way, respectively forming the horizontal isolation region for the NPN transistor and the low-resistivity collector region for the PNP transistor. Within region 2 an N+ type region 4 is then formed serving as a low-resistivity collector region for the NPN transistor.

Figure 5:
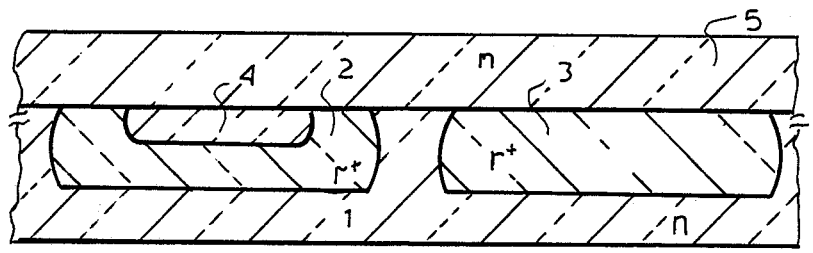

An N type epitaxial layer 5 is than grown, namely one whose conductivity is of the same type as that of the substrate, as illustrated in FIG. 5.

Figure 6:
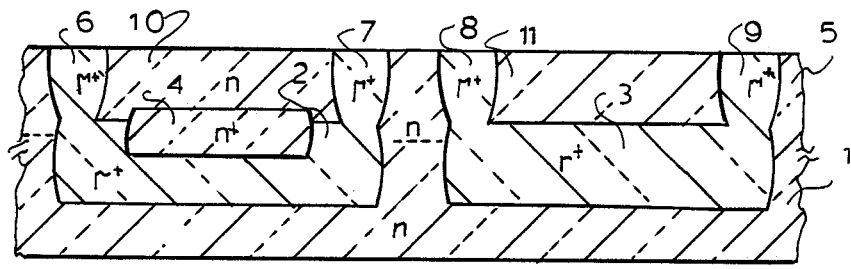
Figure 7:
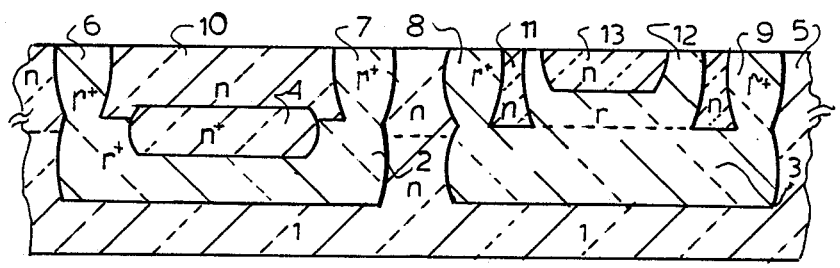

P+ type regions 6, 7, 8 and 9 are then diffused until they join with regions 2 and 3 (FIG. 6). It will be seen that regions 2, 6 and 7 taken together completely surround an N type region 10 within which the base and emitter regions of the NPN transistor will then be diffused, while regions 3, 8 and 9 all together act as a collector region for the PNP transistor.

Within the N type region 11, a P type region 12 is diffused to act as a low-concentration collector region for the PNP transistor. The base of said transistor is formed by known methods and is situated inside region 12: it is an N type region and is indicated by the number 13, FIG. 7. P+ type regions 14 and 15 are then made, respectively forming the base of the NPN transistor and the emitter of the PNP transistor, region 14 being realized in such a way to ensure a low-concentration collector thickness of transistor NPN (see thickness s1 of FIG. 8) practically equal to the low-concentration collector thickness of transistor PNP (see thickness s2 of the same figure).

Than the four regions 16, 17, 18, 19 are diffused, these being respectively the emitter of the NPN transistor and enrichments for the contact regions of the collector of the NPN transistor, of the base of the PNP transistor and of the N type isolation region formed by regions 1 and 5 together (FIG. 8).

Clearly the N type isolation region must be connected at the point of highest potential among all those present in the device in order to have the various components electrically insulated from each other.

Finally the areas of contact are defined and the metallization process carried out thus guaranteeing interconnections among the various components of the integrated circuit.

FIG. 9 gives some typical profiles of doping concentration along a section of the NPN and PNP transistors made according to the invented process; the profiles represent the logarithm of concentration c (atoms/cm$^3$) of dopant in relation to the depth p of some points on the section (the various regions touched by the section are indicated on the axis of the abscissa).

How the invention achieves its purposes will now be explained.

As stated, processes already known provide low-concentration collector thicknesses that differ considerably for the two types of transistors: thickness for the NPN transistor especially is always larger. This means that the maximum operational voltage is fixed by the PNP transistor and current handling of the NPN transistor—being inversely proportional to the square of collector thickness—is penalized as a consequence. Similarly collector series resistance is also increased.

The process according to the invention however eliminates this difference and does so being fulfilled following conditions:
(1) diffusion of the P+ type buried layer takes place before diffusion of the N+ type buried layer;
(2) surface concentration of the N+ type buried layer is larger than that of the opposite type buried layer.

The first of these two circumstances involves the presence of a considerable quantity of dopant in the isolation region 2 ensuring high punch-through voltages for this layer.

The second, however, is a necessary condition for getting the above thicknesses equal. Boron (the P type dopant impurity) is in fact known to have a higher diffusivity coefficient than either arsenic or antimony (the N type dopant impurities which can be used to make region 4); as a result equal surface concentrations generate different out-diffusions. The surface concentration of layer 2 thus has to be lower than that of layer 4 (in the stage illustrated in FIG. 5).

It could be possible to obtain this difference in surface concentration by implanting different amounts of dopant (for instance $5 \cdot 10^{13}$ atoms/cm$^2$ of boron and $10^{15}$ atoms/cm$^2$ of antimony) but to do so would give a P+ type buried layer of rather high resistivity. It is thus preferable to proceed according to the invention by implanting comparable amounts of dopant (e.g. $5.10^{14}$ atoms/cm$^2$ of boron and $10^{15}$ atoms/cm$^2$ of antimony) each followed by different diffusion cycles for the two layers (a long, high temperature diffusion for the boron, a shorter lower temperature diffusion for the antimony) so as to obtain different junction depths.

Finally it should be noted that sheet resistance values in regions 3 and 4 are very similar in spite of marked differences in peak concentrations, remembering that sheet resistance Rs is directly proportional to "r" resistivity of the material and inversely proportional to $X_j$ junction depth, and also that in the N+ type buried layer, "r" resistivity values of the material are lower but that $X_j$ junction depth in the P+ type buried layer is larger because of the long diffusion times to which it has been subjected.

What is claimed is:

1. Process for forming an integrated circuit on a substrate of N type semiconductor material, comprising PNP and NPN transistors with vertical current flow, insulated from each other, in which:
   P+ type regions are diffused on the N type substrate, said regions constituting the horizontal isolation region (2) of the NPN transistors and the low-resistivity collector region (3) of the PNP transistors,
   within the isolation region (2) a high-concentration N+ type zone (4) is diffused, said zone acting as a low-resistivity collector region for the NPN transistor,
   an N type epitaxial layer (5) is then grown all over the surface of the device,
   P+ type regions (6) and (7) are then diffused until they join with region (2), so as inside to define a region (10), and P+ type regions (8) and (9) are diffused until they join with region (3), so as inside to define a region (11), regions (6), (2) and (7) all together acting as an isolation region for the NPN transistor, regions (3), (8) and (9) all together acting as a collector region for the PNP transistor,
   within the N type region (11), a P type region (12) is diffused to act as a low-concentration collector region for the PNP transistor,
   within the P type region (12), an N type region (13) is diffused to act as the base of the PNP transistor,
   within the N type regions (10) and (13), P type regions (14) and respectively (15) are diffused to act as the base of the NPN transistor and respectively as the emitter of the PNP transistor,
   within the P type region (14), an N type region (16) is diffused to act as the emitter of the NPN transistor,
   said diffusions of regions (2) and (4) being made to give the region (2) a surface concentration lower than that of the region (4), characterized in that said region 14 is realized in such a way to ensure that the low-concentration collector thickness (s1) of transistor NPN be practically equal to the low-concentration collector thickness (s2) of transistor PNP.

2. Manufacturing process as in claim 1 characterized in that the regions (2) and zones (4), having different surface concentrations of dopant, are respectively obtained by implantation of comparable quantities of dopant followed by diffusion, and that, in the case of regions (2), diffusion continues for longer and at a higher temperature than for the zones (4).

* * * * *